| (12) | United States Patent | (10) Patent No.: | US 7,810,702 B2 |
|---|---|---|---|
| | Cordes et al. | (45) Date of Patent: | Oct. 12, 2010 |

(54) SOLDER STANDOFFS FOR INJECTION MOLDING OF SOLDER

(75) Inventors: Steven A. Cordes, Yorktown Heights, NY (US); Peter A. Gruber, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 12/166,523

(22) Filed: Jul. 2, 2008

(65) Prior Publication Data

US 2010/0001045 A1  Jan. 7, 2010

(51) Int. Cl.
*H05K 3/34* (2006.01)
*H01L 21/00* (2006.01)
*B23K 31/00* (2006.01)

(52) U.S. Cl. .................. 228/180.22; 228/225; 228/245; 438/6; 438/108; 438/613

(58) Field of Classification Search .................. 228/121, 228/164, 180.22, 245–246, 248.1; 257/737–738; 438/6, 128, 613, 616
See application file for complete search history.

(56) References Cited

U.S. PATENT DOCUMENTS

| 5,244,143 | A | 9/1993 | Ference et al. |
|---|---|---|---|
| 6,184,062 | B1 | 2/2001 | Brofman et al. |
| 6,316,291 | B1 | 11/2001 | Weber |
| 6,559,527 | B2 | 5/2003 | Brofman et al. |
| 6,832,747 | B2 | 12/2004 | Cordes et al. |
| 2006/0035454 | A1 * | 2/2006 | Belanger et al. ............ 438/616 |

* cited by examiner

*Primary Examiner*—Jessica L Ward
*Assistant Examiner*—Devang Patel
(74) *Attorney, Agent, or Firm*—Scully, Scott, Murphy & Presser, P.C.; Daniel P. Morris, Esq.

(57) ABSTRACT

A method of producing standoffs in an injection molded solder (IMS) mold, which possesses cavities, each of which is filled with a solder paste using standard techniques, such as screening or IMS. This solder paste is heated to a reflow temperature at which the solder melts and forms a ball or sphere. Since solder pastes are known to reduce in volume due to the therein contained organic material burning off, the remaining solder ball will be significantly lower in volume than that of the cavity. A solder material having a lower melting point is then filled into the cavities about the solder balls. The mold and solder metal are then allowed to cool, resulting in the formation of a solid sphere of metal in the cavity surrounded by solder material of a lower melting point, which, upon transfer to a wafer, form the standoffs.

1 Claim, 2 Drawing Sheets

SOLDER STANDOFFS FOR INJECTION MOLDING OF SOLDER

BACKGROUND OF THE INVENTION

1. Field of the Invention

The present invention generally pertains to the injection molding of solder, and more particularly relates to a method in the formation of stand solder standoff in a solder bumping process, such as in injection molded solder molds.

2. Discussion of the Prior Art

In modern semiconductor devices, the ever-increasing electronic component densities on the devices and reduced dimensions of the devices demand more stringent requirements in the packaging or interconnecting techniques thereof. Generally, a known flip-chip attachment method has been used in the packaging of IC chips, wherein a formation of solder balls was carried out by an evaporation method of lead and tin through a mask for producing the desired solder balls. Another method employs electroplating of solder, which requires large volumes of chemical baths and which is especially hazardous due to the fact that many solders contain lead.

Another known method for depositing solder balls is solder paste screening. However, with the recent trend in the miniaturization of device dimensions and the reduction in bump-to-bump spacing (or pitch), the solder paste screening technique becomes impractical. For instance, one of the problems in applying solder paste screening technique to modern IC devices is the paste composition itself, in that this is generally composed of a flux and solder alloy particles. The consistency and uniformity of the solder paste composition becomes more difficult to control with a decreasing solder bump volume.

A more recently developed injection molded solder ("IMS") technique has improved upon the foregoing methods by dispensing molten solder instead of solder paste. However, some problems have been encountered when the technique is implemented to wafer-sized substrates. U.S. Pat. No. 5,244, 143, which is commonly assigned to the assignee of the present application, discloses the fundamentals of the injection molded solder technique, and the disclosure of which is incorporated herein by reference in its entirety. One of the advantages of the IMS technique is that there is very little volume change between the molten solder and the resulting solder bump. The IMS technique utilizes a solder head that fills boro-silicate glass molds that are wide enough to cover most single chip modules.

Applying a molten solder to a substrate in a transfer process step then implements the IMS method for solder bonding. When smaller substrates, i.e., chip scale or single chip modules are employed, the transfer step is readily accomplished since the solder-filled mold and substrate are relatively small in area and thus can be easily aligned and joined in a number of configurations. For instance, a process of split-optic alignment is frequently used in joining chips to substrates, whereby the same process may also be used in order to join a chip-scale IMS mold to a substrate (chip) which is to be bumped. The solder, which is applied to semiconductor wafers for flip chip bonding, forms the electrical connection between the device substrate (i.e., silicon chip) and the package (e.g. ceramic module, organic package, etc), as well as providing the mechanical connection between the device and the package. The mechanical properties of the connection are controlled by the properties of the materials, such as tensile strength, ductile strength and surface tension. These properties also play a role in a so-called standoff height, i.e., the separation between the two substrates. Under no-load conditions, this standoff will be largely controlled by the surface tension of the material. However, as the load increases, the standoff will be decreased to the point of contact between the nearest points, such that can reduce the integrity of the connection between the components.

SUMMARY OF THE INVENTION

Pursuant to the present invention, standoffs are formed in an injection molded solder (IMS) mold, which possesses cavities, each of which is filled with a solder paste using standard techniques, such as screening or IMS. This solder paste is heated to a reflow temperature at which the solder melts and forms a ball or sphere. Since solder pastes are known to reduce in volume due to the therein contained organic material burning off, the remaining solder ball will be significantly lower in volume than that of the cavity. A solder material having a lower melting point is filled into the cavities to fill any voids about the solder balls. The mold and solder metal are then allowed to cool, resulting in the formation of a solid sphere of metal in the cavity embedded in the lower melting point solder material, and is the transferred to a wafer to form the standoffs of precise dimensions.

In a somewhat modified embodiment of the invention, the cavities are filled with a powder, which consists of solder and metal particles that does not require flux. The powder is brought to a reflow temperature for the solder in a reducing atmosphere (e.g., formic acid gas); thereby allowing the solder particles to melt and combine in a liquid form, and which will form a sphere due to surface tension. The mold and metal are now allowed to cool, resulting in a solid sphere consisting of metal in the cavity surrounded by air.

The mold is now filled with a lower-temperature solder material using IMS, such that each cavity now contains a sphere, which is surrounded by molten solder, whereupon the mold is now allowed to cool to the extent such that the higher-temperature solder is embedded in the lower temperature solder. The composite solder is then transferred from the mold to a device wafer, employing standard known techniques. As long as the temperature does not exceed the melting temperature of the higher melting point solder, those spheres will act as standoffs in each solder ball. In this invention, the standoffs are automatically the precise size required, or can be accurately controlled. They are produced using standard, existing techniques, and are easily manufactured using bulk processes.

Accordingly, it is an object of the present invention to provide a novel method of forming solder standoffs in an injection molded solder (IMS) mold.

BRIEF DESCRIPTION OF THE DRAWINGS

Reference may now be made to the following detailed description of preferred embodiments of the invention; taken in conjunction with the accompanying drawings; in which.

DETAILED DESCRIPTION OF THE INVENTION

Figure 1A:
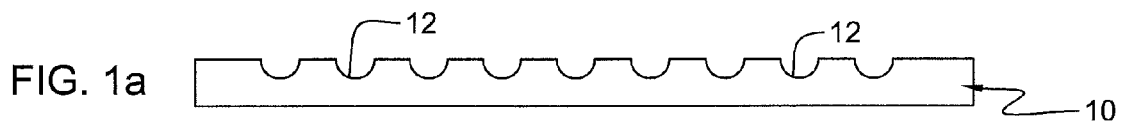
FIGS. 1a through 1g illustrate sequential method steps in forming solder standoffs in an injection molded solder (IMS) mold utilizing a solder paste.

Referring now in detail to the embodiment of the inventive method, as represented in FIGS. 1a through 1g of the drawings, FIG. 1a illustrates an essentially standard injection molded solder (IMS) mold 10 incorporating a plurality of cavities 12, which in this case are hemispherical in shape. The mold, as is well known in the technology, is generally formed of a dielectric material, such as a boro-silicon, or the like.

Figure 1B:
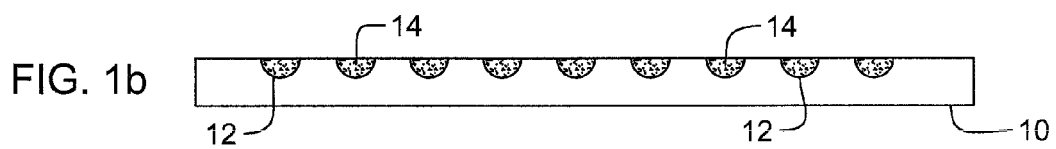

As indicated in FIG. 1b of the drawings, each of the cavities 12 of the mold 10 is filled with a solder paste 14, which essentially consists of a mixture of an organic material and a metal employing standard techniques, such as IMS or paste screening. Hereby, the solder paste 14 can be constituted of a solder paste material composed of a flux and solder, or alternatively, it may also include other metallic particles to increase conductivity, as well as other organic materials for purposes of volume change, wettability and the like, depending upon intended use.

Figure 1C:
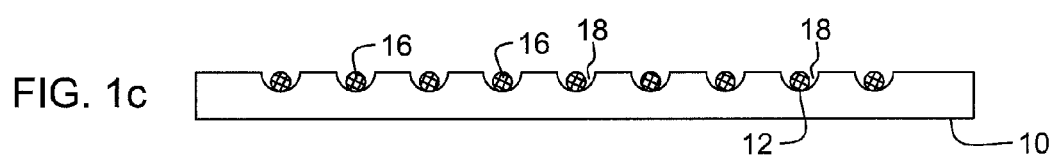

The filled mold 10 is now raised to a desired reflow temperature for the metal in the solder paste, thereby causing a burning off of any organic materials contained therein, so as to form spheres 16 and voids 18, as shown in FIG. 1c of the drawings. The amount of the organic materials in the solder paste being burned off will determine the size of the respective formed balls or spheres 16, but the latter must be no higher than the surface 20 of the mold 10 containing the cavities 12.

Figure 1D:
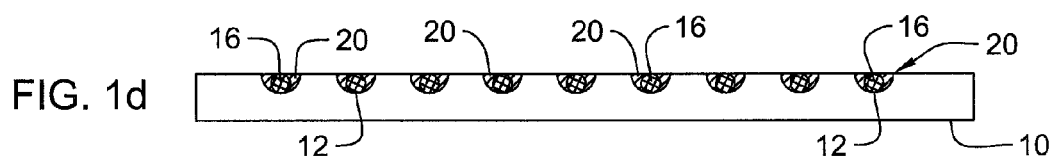
Figure 1E:
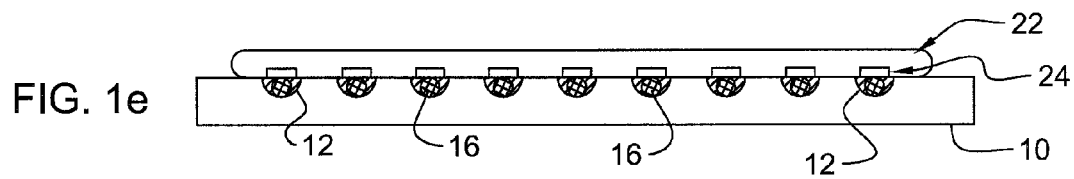
Figure 1F:
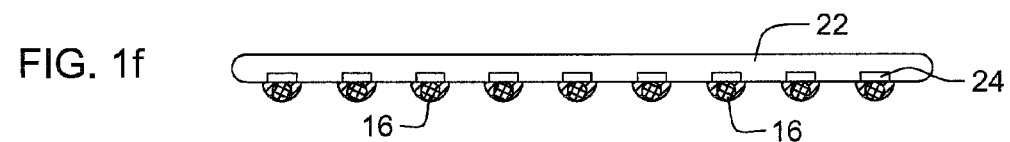
Figure 1G:
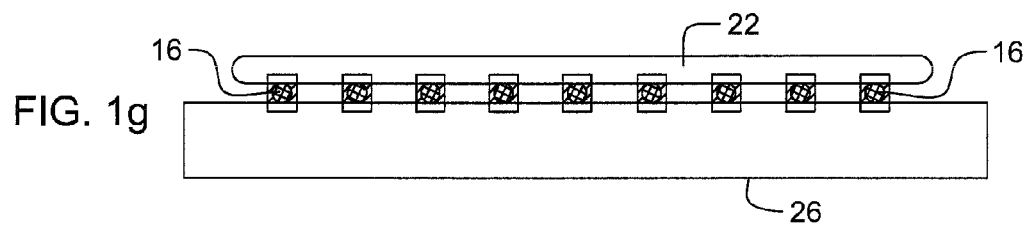

Thereafter, the voids in the cavities 12 in the mold 10, while containing the spheres 16, are again filled with a solder 20 possessing a lower melting point than the previous solder paste material 14, using the IMS process, whereby the voids 18 are filled with the new solder material 20, as shown in FIG. 1d of the drawings. The mold 10, upon cooling, is then aligned with a wafer 22, enabling contact between solder balls 16 and contacts 24 on the wafer, as illustrated in FIG. 1e of the drawings, and the solder transferred from the mold, as shown in FIG. 1f of the drawings. This enables the wafer 22, which comprises a constituent of an electronic device or package to be joined to a substrate 26, as shown in FIG. 1g of the drawings, without collapsing the solder balls 16.

Figure 2A:
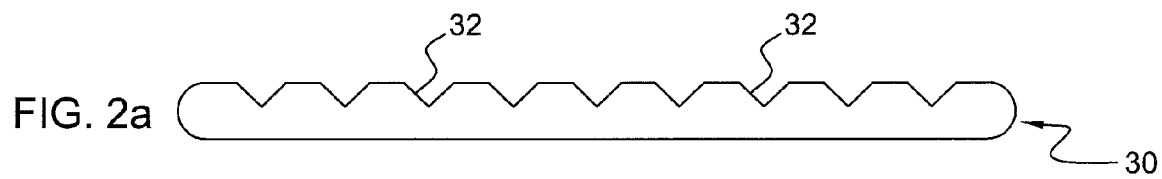
FIGS. 2a through 2e illustrate similar sequential method steps in forming solder standoffs in an injection molded solder (IMS) mold utilizing a powder which consists of a composite of solder and metal particles.
Figure 2B:
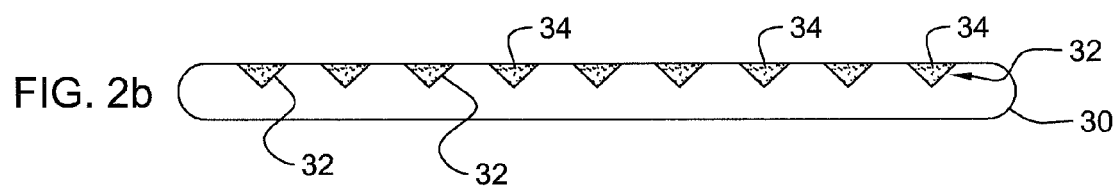
Figure 2C:
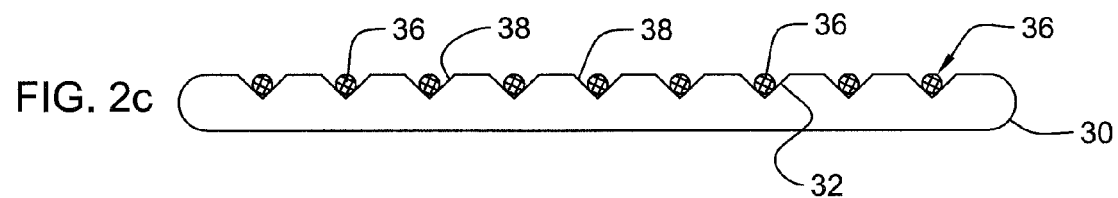
Figure 2D:
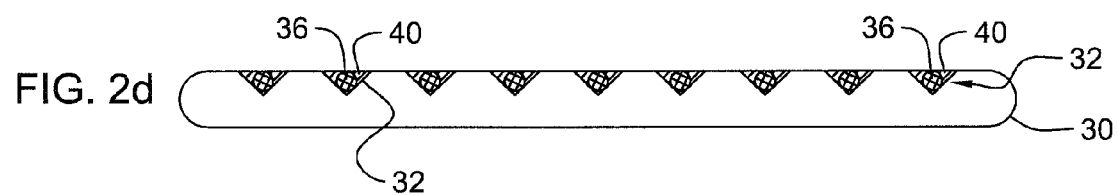
Figure 2E:
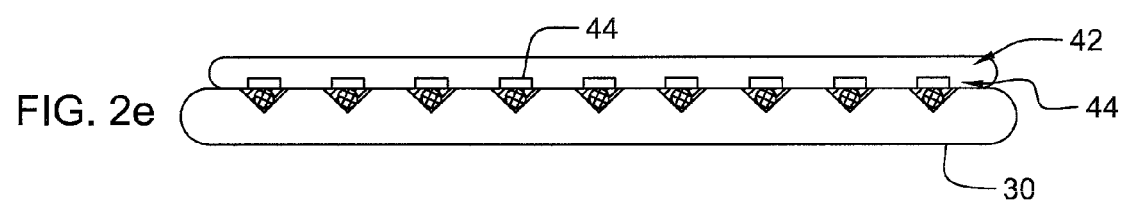

Reverting to the modified embodiment of FIG. 2a through FIG. 2e of the drawings, in this instance, FIG. 2a shows a mold 30, preferably silicon, and incorporates cavities 32, which are each essentially of a V-shaped configuration in cross section. In this embodiment, solder paste 34 is filled into the cavities 32, as in FIG. 2b, and is heated to the reflow temperature so as to form into solder balls 36, as shown in FIG. 2c. Thereafter, voids 38 about the formed solder balls 36 are filled with a solder 40 possessing a lower melting point, as shown in FIG. 2d of the drawings, and the mold, as shown in FIG. 2e, is joined to in alignment with a wafer 42 having contact pads 44, in a manner similar to that of FIG. 1f.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method of forming solder standoffs for solder in injection molded solder molds, said method comprising:

providing a mold consisting of a silicon material and having a plurality of cavities formed in a surface thereof;

filling each of said cavities with a solder paste to a level of said mold surface using a standard injection molding process, the solder paste comprising a mixture of solder, flux, diverse metallic particles to increase conductivity, and organic constituents to vary volumetric changes and wettability;

imparting heat to said solder paste in said mold cavities so as to burn off said organic constituents and form voids and metallic solder balls of a size reaching to the surface level of said mold wherein the voids form about said solder balls;

filling said voids present in said cavities about said solder balls with a solder material possessing a lower melting point than the solder paste initially filled into said cavities;

cooling said mold such that the solder balls which are constituted of the higher melting point material are embedded in said lower melting point solder material; and transferring said embedded solder balls and solder material to a semiconductor wafer so as to form said standoffs having precisely defined dimensions.

* * * * *